United States Patent
Adiga

(10) Patent No.: US 12,423,772 B2
(45) Date of Patent: Sep. 23, 2025

(54) SYSTEMS AND METHODS FOR HYBRID ENHANCEMENT OF SCANNING ELECTRON MICROSCOPE IMAGES

(71) Applicant: FEI Company, Hillsboro, OR (US)

(72) Inventor: Umesh Adiga, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 441 days.

(21) Appl. No.: 17/674,412

(22) Filed: Feb. 17, 2022

(65) Prior Publication Data

US 2023/0260085 A1    Aug. 17, 2023

(51) Int. Cl.
| | |
|---|---|
| G06T 3/4076 | (2024.01) |
| G06T 5/20 | (2006.01) |
| G06T 5/70 | (2024.01) |
| H01J 37/22 | (2006.01) |
| H01J 37/26 | (2006.01) |
| H01J 37/28 | (2006.01) |

(52) U.S. Cl.
CPC .............. G06T 3/4076 (2013.01); G06T 5/20 (2013.01); G06T 5/70 (2024.01); H01J 37/222 (2013.01); H01J 37/263 (2013.01); G06T 2207/10061 (2013.01); G06T 2207/20081 (2013.01); G06T 2207/20084 (2013.01); G06T 2207/20212 (2013.01); H01J 37/28 (2013.01)

(58) Field of Classification Search
CPC .......... G06T 3/4076; G06T 5/20; G06T 5/70; G06T 2207/10061; G06T 2207/20081; G06T 2207/20084; G06T 2207/20212; G06T 3/4053; G06T 5/50; G06T 3/40; G06T 2207/20221; H01J 37/222; H01J 37/263; H01J 37/28; H01J 2237/221; G06N 20/00

USPC .......................................................... 382/155
See application file for complete search history.

(56) References Cited

U.S. PATENT DOCUMENTS

| | | | | |
|---|---|---|---|---|
| 7,598,492 | B1 * | 10/2009 | Krzeczowski | H01J 37/222 250/306 |
| 2004/0021076 | A1 * | 2/2004 | Kadyshevitch | H01J 37/32935 257/E21.53 |
| 2006/0289804 | A1 * | 12/2006 | Knippelmeyer | B82Y 40/00 250/492.22 |
| 2017/0347061 | A1 * | 11/2017 | Wang | G06N 3/04 |
| 2019/0005629 | A1 * | 1/2019 | Sharma | G06T 3/4046 |
| 2020/0013155 | A1 * | 1/2020 | Putman | G06T 3/4038 |
| 2020/0258197 | A1 * | 8/2020 | Tai | G06N 3/045 |
| 2021/0043418 | A1 * | 2/2021 | Abe | H01J 37/222 |
| 2021/0217580 | A1 * | 7/2021 | Ootsuga | H01J 37/244 |
| 2022/0261973 | A1 * | 8/2022 | Komatsuzaki | G06V 10/764 |
| 2023/0335374 | A1 * | 10/2023 | Gaury | H01J 37/244 |

* cited by examiner

*Primary Examiner* — Jennifer Mehmood
*Assistant Examiner* — Pardis Sohraby
(74) *Attorney, Agent, or Firm* — Kilpatrick Townsend & Stockton LLP

(57) ABSTRACT

Methods and systems for performing a hybrid machine learning method for enhancing scanning electron microscopy (SEM) images are disclosed herein. Methods include the steps of acquiring a plurality of images of a region of a sample that were each generated by irradiating the sample with a pulsed charged particle beam, upscaling each of the individual images to generate a plurality of upscaled images of the region of the sample, and combining the plurality of upscaled images to form a noise reduced image of the region of the sample.

20 Claims, 4 Drawing Sheets

SYSTEMS AND METHODS FOR HYBRID ENHANCEMENT OF SCANNING ELECTRON MICROSCOPE IMAGES

BACKGROUND OF THE INVENTION

The field of charged particle microscopy is continuously pushing the boundaries of accuracy, clarity, and magnification. As the magnification capabilities of charged particle microscopes have increased, the regions of the samples that are being irradiated by the charged particle beams of such microscope systems as also gotten smaller. Because the features of samples being irradiated have gotten smaller and more susceptible to irradiation damage, the sample damage caused by such focused irradiation has become a primary limiting factor for investigation samples at the cutting edge of charged particle microscope magnification levels.

A number of strategies have been employed to mitigate such sample damage. For example, a first strategy employed by current systems has been to decrease the beam strength of the charged particle beam during irradiation. While this reduction of beam strength lowers the sample, damage caused by the irradiation of the sample, it also decreases the emissions resultant from the irradiation. Thus, with fewer emissions generated by the irradiation, the reduction in sample damage has an outcome of greatly reducing the detector data and thus decreasing the information in sample images generated therefrom, obtained with the lower power beam.

A second solution employed by current systems is to use a pulsed charged particle beam to irradiate the sample, where the sample is irradiated periodically with discrete beam portions over short time windows. While each pulse only causes a discrete amount of sample data, due to the brevity of the beam pulses, the emissions the pulses induce from the sample are greatly reduced compared to traditional steady beam irradiation techniques. This results in a decrease in detector data which can be generated from each beam pulse, resulting in the images having very little sample information and a poor signal-to-noise ratio. To compensate for this reduction in data, current systems combine the information from a plurality of images captured across multiple pulses to get a final image. While this allows for an improvement in the ability of current charged particle systems to investigate samples at the limits of their magnification capabilities, there remains a desire to have new investigation techniques that are able to further push the limits of investigation limits of charged particle microscopy.

SUMMARY OF THE INVENTION

Methods and systems for performing a hybrid machine learning method for enhancing scanning electron microscopy (SEM) images are disclosed herein. Methods include the steps of acquiring a plurality of images of a region of a sample that were each generated by irradiating the sample with a pulsed charged particle beam, upscaling each of the individual images to generate a plurality of upscaled images of the region of the sample, and combining the plurality of upscaled images to form a noise-reduced image of the region of the sample.

Systems for performing a hybrid machine learning method for enhancing SEM images comprise, a pulsed charge particle source configured to emit a pulsed charged particle beam towards a sample, an optical column configured to direct the pulsed charged particle beam to be incident on the sample, a sample holder configured to hold the sample, and a detector system configured to generate detector data from emissions from the sample resultant from one or more pulses of the pulsed charged particle beam being incident on the sample. The systems further include one or more processors, and a memory storing non-transitory computer readable instructions that, when executed on the one or more processors cause the processors to acquire a plurality of images of a region of the sample that were each generated by irradiation of the sample with the pulsed charged particle beam, upscale each of the individual images to generate a plurality of upscaled images of the region of the sample, and combine the plurality of upscaled images to form a noise-reduced image of the region of the sample.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicates similar or identical items.

Like reference numerals refer to corresponding parts throughout the several views of the drawings.

DETAILED DESCRIPTION OF EMBODIMENTS

Methods and systems for performing a hybrid machine learning method for enhancing charged particle images are disclosed. More specifically, the disclosure includes methods and systems in which a plurality of images of a sample are generated using a pulsed charged particle beam, and then the individual images are upscaled. The individually upscaled images may then be combined to form a combined upscaled image of the sample having an enhanced image quality over prior art imaging techniques that use pulsed charged particle beams. In some embodiments, the individual images are upscaled using a machine learning algorithm that is trained to upscale the images using non-linear transformations to improve the signal to noise ratio and contrast to noise ratio while also increasing the size of the image by a desired factor. Additionally, when the images are upscaled in this way, the combined upscaled image may then also be downsized using a linear algorithm to its original dimensions, with the image resultant from such an upscaling and downsizing being a much more enhanced image of the sample. It is known that linearly downsizing an image so that its dimensions are reduced in half, the signal to noise ratio is increased by a factor of the square root of two. Normally, this increase is cancelled out when used in combination with a linear upscaling algorithm, but because the upscaled combined image of the sample according to the present disclosure may be enhanced in a non-linear fashion, when the upscaled image is downsized linearly the net result of the process of such an upscaling and downscaling is that the signal to noise ratio is increased by the square root of two for 2× upscaling.

Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

Figure 1:
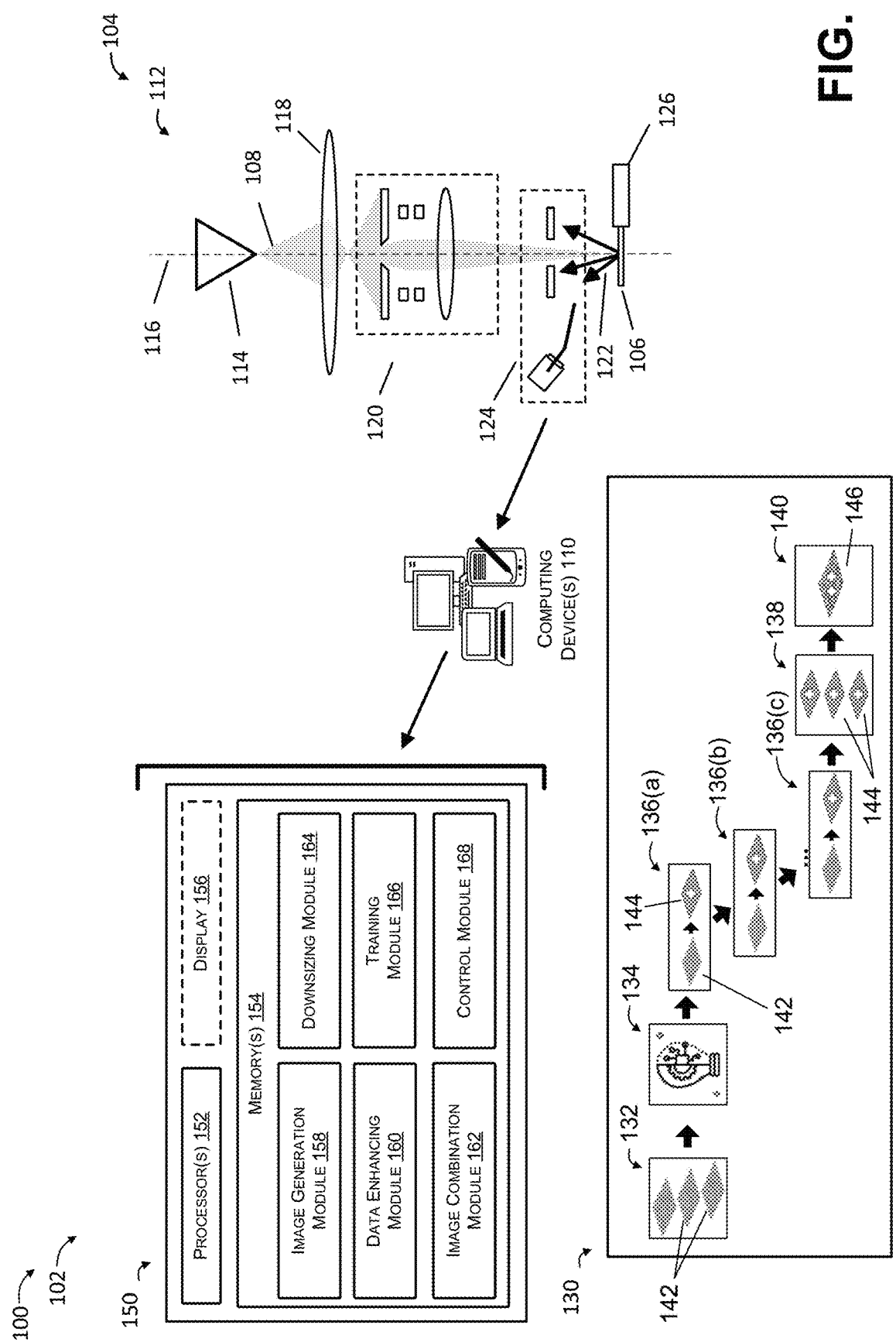
FIG. 1 illustrates example systems for performing a hybrid machine learning method for enhancing charged particle images.

FIG. 1 illustrates example systems 100 for performing a hybrid machine learning method for enhancing charged particle images. Specifically, FIG. 1 shows an example environment 102 that includes an example microscope system(s) 104 for imaging a sample 106 using a pulsed charged particle beam 108, and a computing devices 110 configured to perform post processing on detector data generated by irradiation of the sample 106 with the pulsed charged particle beam 108. It is noted that present disclosure is not limited to environments that include microscopes, and that in some embodiments the environments 100 may include a different type of system that is configured to manipulate and/or otherwise examine samples 106, or may only include the computing devices 108.

The example microscope system(s) 104 may be or include one or more different types of optical, and/or charged particle microscopes, such as, but not limited to, a scanning electron microscope (SEM), a scanning transmission electron microscope (STEM), a transmission electron microscope (TEM), a charged particle microscope (CPM), a cryo-compatible microscope, focused ion beam (FIB) microscope, dual beam microscopy system, or combinations thereof. FIG. 1 shows the example microscope system(s) 104 as being a SEM including a SEM column 112 configured to irradiate the sample 106 with pulsed charged particle beam 108.

The SEM column 112 includes an electron source 114 (e.g., a thermal electron source, Schottky-emission source, field emission source, etc.) that emits a pulsed electron beam 108 along an electron emission axis 116 and towards the sample 106. Persons having skill in the art would understand that there are many types of setups for creating such a pulsed charged particle beam, and that the example setups described herein are merely some of the known ways to generate pulsed charged particle beams. Non-limiting examples of such setups include, an electron source 114 that releases pulses of electrons in response to laser pulses being incident on an emitting portion of the electron source, charged particle beam 108 being shaped into pulses by a blanker downstream of the electron source 114, or a combination thereof. The electron emission axis 116 is a central axis that runs along the length of the example microscope system(s) 104 from the electron source 114 and through the sample 106. While FIG. 1 depicts the example microscope system(s) 104 as including an electron source 115, in other embodiments the SEM column 110 may comprise a charged particle source, such as an ion source, configured to emit a plurality of charged particles toward the sample 106.

An accelerator lens 118 accelerates/decelerates, focuses, and/or directs the pulsed electron beam 108 towards an electron focusing column 120. The electron focusing column 120 focuses the pulsed electron beam 108 so that it is incident on at least a portion of the sample 106. Additionally, the focusing column 120 may correct and/or tune aberrations (e.g., geometric aberrations, chromatic aberrations) of the pulsed electron beam 108. In some embodiments, the electron focusing column 120 may include one or more of an aperture, deflectors, transfer lenses, scan coils, condenser lenses, objective lens, etc. that together focus electrons from electron source 114 onto a small spot on the sample 106. Different locations of the sample 106 may be scanned by adjusting the electron beam direction via the deflectors and/or scan coils. In this way, the pulsed electron beam 108 may act as an imaging beam that is scanned across a surface layer of the sample (i.e., the surface of the layer proximate the SEM column 104 and/or that is irradiated by the pulsed electron beam 108). This irradiation of the surface layer of the sample 106 causes the component electrons of the electron beam 108 to interact with component elements/molecules/features of the sample, such that component elements/molecules/features cause emissions 122 to be emitted by the sample 106. The specific emissions that are released are based on the corresponding elements/molecules/features that caused them to be emitted, such that the emissions can be analyzed to determine information about the corresponding elements/molecules. Additionally, while FIG. 1 illustrates the emissions 122 as traveling upstream of the sample 106, a person having skill in the art would understand that emissions may be released in other directions, including but not limited to downstream of the charged particle source 114.

FIG. 1 further illustrates detector systems 124 for detecting emissions 122 resultant from pulses of the pulsed electron beam 108 being incident on the sample 106. The detector system 124 may comprise one or more detectors positioned or otherwise configured to detect such emissions. For example, a charged particle system according to the present invention may include a detector system positioned below the sample 106, a detector system positioned above the sample 106, or both. In various embodiments, different detectors and/or different portions of single detectors may be configured to detect different types of emissions or be configured such that different parameters of the emissions detected by the different detectors and/or different portions. The detector system 124 is further configured to generate a data/data signal corresponding to the detected emissions and transmit the data/data signal to one or more computing devices 110.

FIG. 1 further illustrates the example microscope system(s) 104 as further including a sample holder 126 configured to hold the sample 106. In some embodiments, the sample holder 126 and can translate, rotate, and/or tilt the sample 106 in relation to the example microscope system(s) 104. For example, the sample holder 126 may comprise a grid or structure on which a sample or a specimen is to be attached and/or otherwise held by. Additionally, the system may also include a sample manipulator that is able to interact with the sample 106 such that the sample may be translated, angled, and/or rotated with relation to the sample holder 126 and/or example microscope system(s) 104.

The environment 100 is also shown as including one or more computing device(s) 110. Those skilled in the art will appreciate that the computing devices 110 depicted in FIG. 1 are merely illustrative and are not intended to limit the scope of the present disclosure. The computing system and devices may include any combination of hardware or software that can perform the indicated functions, including computers, network devices, internet appliances, PDAs, wireless phones, controllers, oscilloscopes, amplifiers, etc. The computing devices 110 may also be connected to other devices that are not illustrated, or instead may operate as a stand-alone system.

It is also noted that one or more of the computing device(s) 110 may be a component of the example microscope system(s) 104, may be a separate device from the example microscope system(s) 104 which is in communication with the example microscope system(s) 104 via a network communication interface, or a combination thereof. For example, an example microscope system(s) 104 may include a first computing device 110 that is a component portion of the example microscope system(s) 104, and which acts as a controller that drives the operation of the example charged particle microscope system(s) 104 (e.g., adjust the scanning location on the sample by operating the scan coils, etc.). In such an embodiment the example microscope system(s) 104 may also include a second computing device 110 that is a desktop computer separate from the example microscope system(s) 104, and which is executable to process data received from the detector system 124 to generate images of the sample 106 and/or perform other types of analysis or post-processing of detector data. The computing devices 128 may further be configured to receive user selections via a keyboard, mouse, touchpad, touchscreen, etc. The computing device(s) 110 are configured to generate images of the surface layer of the sample 106 within the example microscope system(s) 104 based on data and/or the data signal from the detector system 124.

Additionally, the computing device(s) 110 are configured to control the SEM column 112, the sample manipulator, and/or sample holder 126 to allow for the performance of sample creation, sample manipulations, and irradiation of the sample 106 with the pulsed charged particle beam 108. For example, one or more user selections, an automation program, or a combination thereof may allow the computing devices 110 to cause a sample holder 126 or sample manipulation device to be translated (e.g., translated, angled, and/or rotated) such that at least a portion of the sample 106 is positioned such that a region of interest on the sample can be irradiated with the pulsed charged particle beam. Once the sample 106 is positioned in this way, user selections, an automation program, or a combination thereof cause the sample to be irradiated by the pulsed charged particle beam 108, and the computing devices 110 receive detector data from the detector system 124 based on the emission detected by the detectors.

User selections, an automation program, or a combination thereof may then cause the computing devices 110 to generate a plurality of images based on the detector data captured, where individual images are generated based on emissions resultant from a corresponding set of one or more beam pulses irradiating the sample. The computing devices 110 can then upscale each of the individual images to generate a plurality of upscaled images of the region of the sample, and then the plurality of upscaled images to form a noise reduced image of the region of the sample. For example, the computing devices may upscale the images by applying an algorithm (e.g., an upscaling algorithm, an image enhancement algorithm, etc.) that reduces the noise in the individual images, increases the dimensional size of the individual images, or a combination thereof. In some embodiments, the computing devices 110 can further downscale the upscaled combined image to generate a combined image of a desired size. Moreover, the upscaling algorithms may include machine learning algorithms that are trained to apply one or more non-linear transformations to improve the signal to noise ratio and contrast to noise ratio while also increasing the size of the image by a desired factor, then if such a non-linearly upscaled image is downsized linearly the net result of the process of such an upscaling and downscaling is that the signal to noise ratio is of the final combined image is improved over a similar image combined using prior art techniques by at least a square root of two.

FIG. 1 also depicts a visual flow diagram 130 that includes a plurality of images that together depict an example process that may be performed by the computing device(s) 110 to perform a hybrid machine learning method for enhancing pulsed charged particle images. For example, image 132 shows an image of low information a plurality of images 142 that have each been generated based on emissions resultant from a different set of one or more beam pulses. Image 134 illustrates the computing device(s) 110 applying an upscaling algorithm to the plurality of images 142. Images 136($a$)-($c$) show the results of the upscaling algorithm. Specifically, images 136($a$)-($c$) show an individual image 142 being upscaled to generate an upscaled individual image 144. For example, the computing devices 110 may upscale the images by applying an algorithm that reduces the noise in the individual images, increases the dimensional size of the individual images, or a combination thereof. Images 138 and 140 show a plurality of the individual upscaled images 144 being collected and then combined to form a combined upscaled image 146. While not shown in diagram 130, in some embodiments the computing device(s) 110 may further downscale the upscaled combined image to generate a combined image of a desired size.

FIG. 1 further includes a schematic diagram illustrating an example computing architecture 150 of the computing devices 128. Example computing architecture 150 illustrates additional details of hardware and software components that can be used to implement the techniques described in the present disclosure. Persons having skill in the art would understand that the computing architecture 150 may be implemented in a single computing device 110 or may be implemented across multiple computing devices. For example, individual modules and/or data constructs depicted in computing architecture 150 may be executed by and/or stored on different computing devices 110. In this way, different process steps of the inventive methods disclosed herein may be executed and/or performed by separate computing devices 110 and in various orders within the scope of the present disclosure. In other words, the functionality provided by the illustrated components may in some implementations be combined in fewer components or distributed in additional components. Similarly, in some implementations, the functionality of some of the illustrated components may not be provided and/or other additional functionality may be available.

In the example computing architecture 150, the computing device includes one or more processors 152 and memory 154 communicatively coupled to the one or more processors 152. While not intended to be limiting, example computing architecture 150 is shown as including an image generation module 158, a data enhancing module 160, an image combination module 162, a training module 164, and a control module 166 stored in the memory 154. As used herein, the term "module" is intended to represent example divisions of executable instructions for purposes of discussion and is not intended to represent any type of requirement or required method, manner, or organization. Accordingly, while various "modules" are described, their functionality and/or similar functionality could be arranged differently (e.g., combined into a fewer number of modules, broken into a larger number of modules, etc.). Further, while certain functions and modules are described herein as being implemented by software and/or firmware executable on a processor, in other instances, any or all of modules can be implemented in whole or in part by hardware (e.g., a specialized processing unit, etc.) to execute the described functions. As discussed above in various implementations, the modules described herein in association with the example computing architecture 150 can be executed across multiple computing devices 110.

The image generation module 158 can be executable by the processors 152 to cause a computing device 110 to acquire a plurality of images of a region of a sample. For example, the image generation module 158 may acquire a plurality of images that were generated from emissions resultant from irradiating the sample with a pulsed charged particle beam. In some embodiments, the image generation module 158 may acquire the images by generating the plurality of images based on detector data. Such detector data may correspond to a plurality of discrete instances of detector data, where each of the instances of detector data corresponds to detector data acquired in a certain time period corresponding to one or more pulses of the pulsed charged particle beam. In this way, the image generation module 158 may use the information in each instance of detector data to generate a separate low-resolution image of the sample. As the time periods during which each instance of detector data is discrete, while the images generated will be lower resolution (due to the short period of irradiation and limited emissions available to generate the detector data), the low resolution images will show the gradual degradation of the sample due to beam damage, and each will not suffer from blurring effects caused by beam/sample shift.

Alternatively, or in addition, in some embodiments the image generation module 158 may acquire a premade plurality of images that were created by another module another computing device 110, or by the charged particle system 104 itself. The image generation module 158 may access the premade plurality of images from a location stored on the memory 154, from a portable data storage device (e.g., CD, DVD, USB drive, portable hard drive, etc.), or over a network connection (e.g., Bluetooth network, LAN, WAN, Wi-Fi network, the Internet, etc.).

The data enhancing module 160 can be executable by the processors 152 to cause a computing device 110 to upscale each of the individual images to generate a plurality of enhanced (e.g., upscaled) super-resolution images of the region of the sample. As each of the individual images are generated from emissions from a corresponding set of one or more pulses of the charged particle beam irradiating the sample, each of the individual enhanced super-resolution images corresponds to a different pulse of the pulsed charged particle beam.

According to the present invention, the data enhancing module 160 may enhance the individual images by applying an upscaling/image enhancement algorithm to the individual images to generate an enlarged version of each of the images. For example, the data enhancing module 160 may apply an image upscaling algorithm to an individual image that increases the pixel dimensions of the image (e.g., from 2 k×2× pixels to 4 k×4 k pixels). In some embodiments, the upscaling algorithm is a machine learning algorithm (e.g., an artificial neural network (ANN), convolutional neural network (CNN), Fully Convolution Neural Network (FCN), or any kind of neural network architecture (combination of artificial neurons in their full or partial form) etc.) trained to apply one or more non-linear transformations to improve the signal to noise ratio and contrast to noise ratio while also increasing the pixel dimensions of the image by a desired factor (e.g., 1.5×, 2×, 5×, etc.). In this way, the data enhancing module 160 is able to increase the size of the image without adding additional sample information and/or sample distortion. Moreover, because the machine learning algorithm may be trained using a similar data sat of sample images generated using a pulsed charge particle beam, the algorithm may in some embodiments cause the upscaled image to contain more or more accurate sample information than the original image before enhancement.

Additionally, according to the present invention the data enhancing module 160 can be further executable to perform one or more of noise reduction techniques to improve one or more of a signal to noise ratio, techniques to improve a contrast/sharpness of the image, adjustment of the brightness of images to achieve a desired image brightness, adjustment of the gamma of the images, adjustment of the greyscale of the images, use extrapolation techniques to predict sample features from information in the low resolution images, or a combination thereof. For example, the data enhancing module 160 may apply algorithm(s) that an auto leveling filter(s) that adjusts one or more of the contrast, brightness, gamma and grayscale of the images to desired level(s). In some embodiments, such an algorithm may be a machine learning based algorithm that is trained to improve signal to noise ratio, contrast, sharpness, brightness, gamma, greyscale levels, or a combination thereof. For example, the data enhancing module 160 may apply a noise reduction process using deep-learning auto-encoder architecture to improve the signal to noise ratio.

The image combination module 162 can be executable by the processors 152 to cause a computing device 110 to combine the information in two or more of the plurality of upscaled super-resolution images to form a noise reduced image of the region of the sample. Because each of the plurality of images depict essentially the same region of the sample, each of the images contains information on the same region of the sample. This allows the image combination module 162 to identify portions of information across the plurality of images that depict the same feature on the sample, and combine this information to form a combined image having a more detailed depiction of based on the cumulative information. Additionally, when combining the plurality of images the image combination module 162 may be programmed to identify a first of the information in each of the images that correspond to signals and a second portion of the image information that corresponds to noise. In this way, the combined image may be generated such that it has a much-improved signal to noise ratio.

Moreover, in some embodiments the image combination module 162 can be further executable to align each of the plurality of images during the combination process. That is, the image combination module 162 may determine a geometric relationship between the regions of sample depicted in each of the images and then perform a drift correction when combining the images such that the final combined image is a Drift Corrected Frame Integrated (DCFI) image where the information in each image depicting the same features is aligned.

In some embodiments, once the combined image is generated, the data enhancing module 160 can be executable by the processors 152 can be further executable to upscale or otherwise enhance the combined imaged to generate an upscaled combined image. For example, the data enhancing module 160 can be executable by the processors 152 may apply a machine learning upscaling algorithm that is trained to apply one or more non-linear transformations to improve the signal to noise ratio and contrast to noise ratio while also increasing the size of the image by a desired factor. For example, a machine learning upscaling algorithm may be applied to the combined image that is trained to enhance the resolution of the image with reduced loss of image information. Alternatively, or in addition, the data enhancing module 160 may also apply an algorithm that further adjusts one or more of the contrast, brightness, gamma and gray scale to desired level(s).

The downsizing module 164 can be executable by the processors 152 to cause a computing device 110 to apply a downsizing algorithm to downsize to one of the combined image and the enhanced combined image to generate a downsized combined image having desired dimensions. For example, the image downsizing module 164 may apply a downsizing algorithm that is a cubit interpolation algorithm which decreases the dimensions of the combined image so that it has a desired size. Not only is the downsizing module 164 able to decrease the size of the combined image without decreasing the information, but because the previous upscaling is performed using a non-linear machine learning algorithm, the combined process of upscaling and downscaling according to the present invention results in a net improvement in the signal to noise ratio.

The training module 166 can be executable by the processors 152 to cause a computing device 110 to train a machine learning algorithm (e.g., an artificial neural network (ANN), convolutional neural network (CNN), Fully Convolution Neural Network (FCN) etc.) or component machine learning algorithm(s) thereof to upscale or otherwise enhance an individual image captured with a pulsed charged particle beam as discussed above with regard to the data enhancing module 160. In some embodiments the machine learning algorithm is trained using one or more sets of a plurality of low resolution training images that were each generated by irradiating a corresponding sample with a pulsed charged particle beam, and one or more combined training images.

For example, the training module 166 may train the machine learning algorithm or a component machine learning algorithm thereof using a first set of low-resolution training images acquired irradiation of samples using a pulsed charged particle beam, and a second set of high-resolution training images that corresponds to a combined image of a corresponding set of low-resolution training images in the first set of training images. Since the combined training images correspond to drift corrected images composed of the combined image of a corresponding set of training images, the combined images represent an ideal final product of the corresponding individual super-resolution training images. Thus, the machine learning algorithm can be trained by assigning the combined training image as being the ideal result for each of the plurality of low-resolution training issues that have been used to generate that combined image. The training module 166 may be configured to perform additional training with new training data, and then transmit updates the improve the performance of image enhancement algorithm and/or the component machine learning algorithm(s) thereof.

The control module 168 can be executable by the processors 152 to cause a computing device 110 and/or example microscope system(s) 104 to take one or more actions and/or perform functions or maintenance of the systems. In some embodiments, the control module 168 may cause the example microscope system(s) 104 to irradiate the sample 106 with the pulsed charged particle beam 108 (i.e., cause pulses to be emitted, blank the beam to create/sharpen pulses, focus or deflect the beam onto a region of interest on the sample, combinations thereof, etc.), and capture the portions detector data that each correspond to a time window where a corresponding set of one or more pulses of the beam irradiated the sample 106. For example, the control module 168 may cause the example microscope system(s) 104 to perform such a process using example processes described in the remarks regarding FIGS. 2 and 3.

As discussed above, the computing devices 110 include one or more processors 152 configured to execute instructions, applications, or programs stored in a memory(s) 154 accessible to the one or more processors. In some examples, the one or more processors 152 may include hardware processors that include, without limitation, a hardware central processing unit (CPU), a graphics processing unit (GPU), and so on. While in many instances the techniques are described herein as being performed by the one or more processors 152, in some instances the techniques may be implemented by one or more hardware logic components, such as a field programmable gate array (FPGA), a complex programmable logic device (CPLD), an application specific integrated circuit (ASIC), a system-on-chip (SoC), or a combination thereof.

The memories 154 accessible to the one or more processors 152 are examples of computer-readable media. Computer-readable media may include two types of computer-readable media, namely computer storage media and communication media. Computer storage media may include volatile and non-volatile, removable, and non-removable media implemented in any method or technology for storage of information, such as computer readable instructions, data structures, program modules, or other data. Computer storage media includes, but is not limited to, random access memory (RAM), read-only memory (ROM), erasable programmable read only memory (EEPROM), flash memory or other memory technology, compact disc read-only memory (CD-ROM), digital versatile disk (DVD), or other optical storage, magnetic cassettes, magnetic tape, magnetic disk storage or other magnetic storage devices, or any other non-transmission medium that may be used to store the desired information and which may be accessed by a computing device. In general, computer storage media may include computer executable instructions that, when executed by one or more processing units, cause various functions and/or operations described herein to be performed. In contrast, communication media embodies computer-readable instructions, data structures, program modules, or other data in a modulated data signal, such as a carrier wave, or other transmission mechanism. As defined herein, computer storage media does not include communication media.

Those skilled in the art will also appreciate that items or portions thereof may be transferred between memory 154 and other storage devices for purposes of memory management and data integrity. Alternatively, in other implementations, some or all the software components may execute in memory on another device and communicate with the computing devices 110. Some or all of the system components or data structures may also be stored (e.g., as instructions or structured data) on anon-transitory, computer accessible medium or a portable article to be read by an appropriate drive, various examples of which are described above. In some implementations, instructions stored on a computer-accessible medium separate from the computing devices 110 may be transmitted to the computing devices 110 via transmission media or signals such as electrical, electromagnetic, or digital signals, conveyed via a communication medium such as a wireless link. Various implementations may further include receiving, sending, or storing instructions and/or data implemented in accordance with the foregoing description upon a computer-accessible medium.

Figure 2:
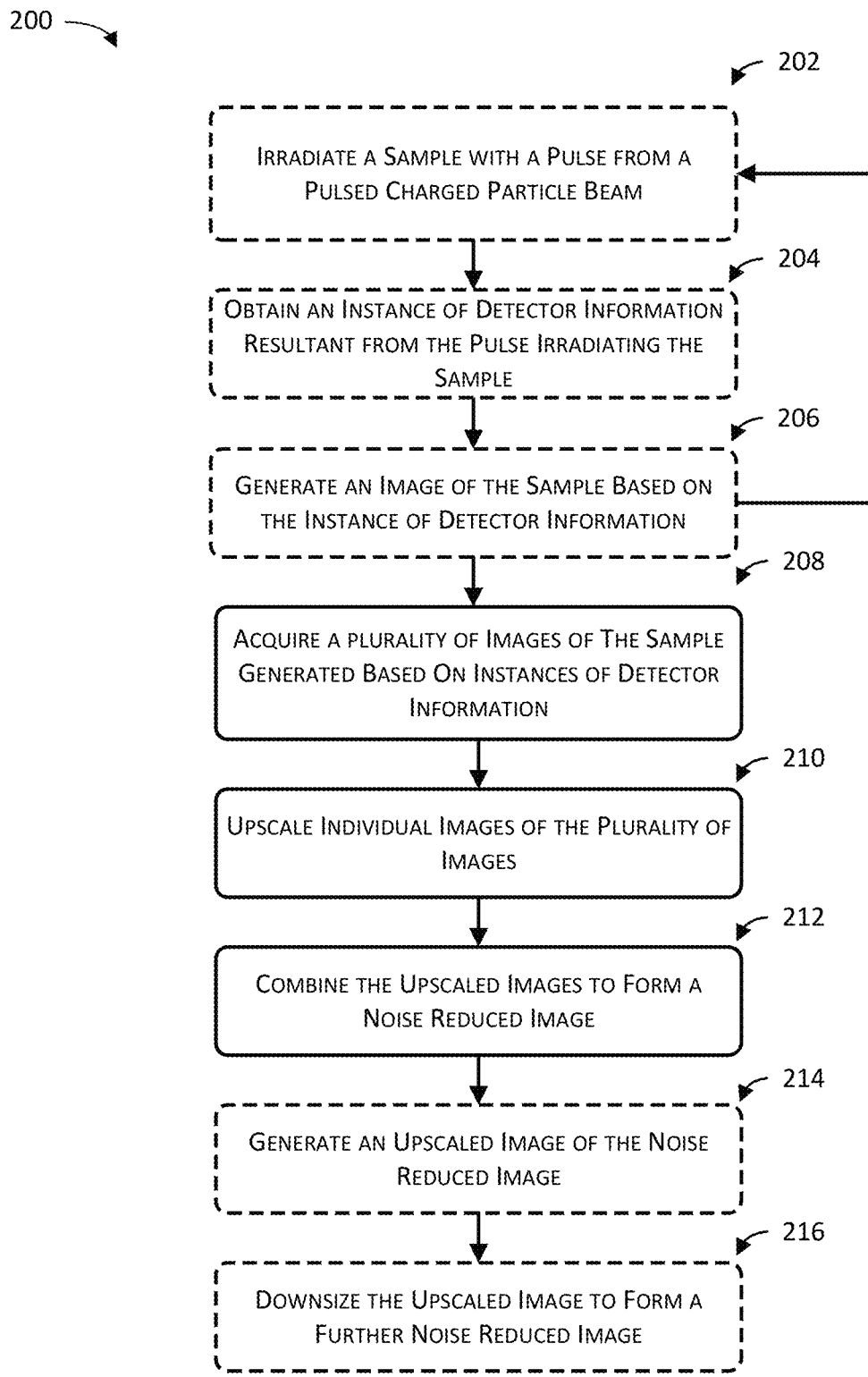
FIG. 2 flow diagram of an illustrative process for performing a hybrid machine learning method for enhancing charged particle images, according to the present disclosure.

FIG. 2 is a flow diagrams of an illustrative process shown as a collection of blocks in a logical flow graph, which represent a sequence of operations that can be implemented in hardware, software, or a combination thereof. In the context of software, the blocks represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the processes.

Specifically, FIG. 2 is a flow diagram of an illustrative process 200 for performing a hybrid machine learning method for enhancing charged particle images. The process 200 may be implemented in example charged particle microscope setup(s) 104 and/or by the computing architecture 150 described above, or in other environments and architectures.

At 202, the sample is optionally irradiated with a pulse from a charged particle beam. Specifically, a charged particle microscope system may cause a pulse from a charged particle beam to be incident upon a region of interest on the sample. Then, a detector system within the charged particle microscope system optionally obtains an instance of detector information resultant from the pulse irradiating the sample is optionally obtained, followed by an image of the sample being optionally generated based on the instance of detector information, at steps 204 and 206, respectively. As the instances of detector data each correspond to detector data acquired within a certain time period corresponding to one or more pulses of the pulsed charged particle beam, the individual images generated in step 206 are low-resolution images which only contain information determined based on the limited emissions caused by said one or more pulses. If there are additional images that are to be obtained, the process returns to step 202 and the sample is irradiated with another pulse from the pulsed charged particle beam. However, if there are not more such images to be obtained, the process continues to step 208, where a plurality of images of the sample generated based on instances of detector information are acquired.

Specifically, at step 208, a plurality of low-resolution images of the sample are acquired, where individual images of the low-resolution images are generated from emissions resultant from one or more corresponding pulses of a pulsed charged particle beam being incident on the region of interest. In some embodiments, the plurality of low-resolution sample images by generating the plurality of images based on detector data as described in optional step 206. As the time periods during which each instance of detector data is discrete, while the images generated will be lower resolution (due to the short period of irradiation and limited emissions available to generate the detector data), the low resolution images will show the gradual degradation of the sample due to beam damage, and each will not suffer from blurring effects caused by beam/sample shift. Alternatively, or in addition, the low-resolution images may be acquired in step 208 by accessing a plurality of premade low-resolution images. Such a premade plurality of images from a location stored an accessible memory, from a portable data storage device (e.g., CD, DVD, USB drive, portable hard drive, etc.), or over a network connection (e.g., Bluetooth network, LAN, WAN, Wi-Fi network, the Internet, etc.).

At 210, individual images of the plurality of images are upscaled. Specifically, an image enhancement algorithm or upscaling algorithm is applied to each of the low-resolution images to generate a plurality of enhanced (e.g., upscaled) images of the region of the sample. As each of the individual images are generated from emissions from a corresponding set of one or more pulses of the charged particle beam irradiating the sample, each of the individual enhanced images corresponds to a different pulse (or collection of pulses) of the pulsed charged particle beam. For example, the upscaling algorithm may enhance the individual images by generating an enlarged version of each of the low-resolution images (e.g., modifying the pixel dimensions of the image from 1 k×2× pixels to 2 k×4 k pixels). In some embodiments, the upscaling algorithm is a machine learning algorithm trained to apply one or more non-linear transformations to improve the signal to noise ratio and contrast to noise ratio while also increasing the size of the image by a desired factor (e.g., 1.5×, 2×, 5×, etc.). In some embodiments, the machine learning algorithm may be further trained using a similar data sat of sample images generated using a pulsed charge particle beam. Because the algorithm may be trained on such similar data, the algorithm may in some embodiments cause the upscaled image to contain more or more accurate sample information than the original image before enhancement. Moreover, in some embodiments the algorithm may be trained to generate a more optimal/desired image by also modifying one or more of a signal to noise ratio, techniques to improve a contrast/sharpness of the image, adjustment of the brightness of images to achieve a desired image brightness, adjustment of the gamma of the images, adjustment of the greyscale of the images, use extrapolation techniques to predict sample features from information in the low resolution images, or a combination thereof.

At 212, the upscaled images are combined to form a noise reduced image. The images from the plurality of upscaled images are combined to form a noise reduced, high-resolution image of the region of the sample. Because each of the plurality of images depict essentially the same region of the sample, each of the images contains information on the same region of the sample. Because combining the plurality of images greatly increases the sample information within the image, the combined image may be generated such that it has a much-improved signal to noise ratio. Moreover, in some embodiments the information in each low-resolution and/or super-resolution image may be aligned during the combination process so as to cause a drift correction which compensates for beam and/or sample drift during irradiation across the plurality of beam pulses such that the final combined image is a DCFI image.

At 214, an upscaled image of the noise reduced image is optionally generated. That is, the upscaling algorithm (e.g., the upscaling algorithm described in step 210 or an upscaling algorithm having similar functionality) may be applied to the combined high-resolution image of the sample may apply a machine learning upscaling algorithm that is trained to apply non-linear transformations that increase the size of the combined image. Moreover, in some embodiments of the present disclosure the low-resolution images are not upscaled in step 210, and instead only the combined high-resolution images are upscaled.

At 216, the upscaled image is optionally downsized to form a further noise reduced image. That is, a downsizing algorithm is applied to one of the combined high-resolution images and the enhanced combined high-resolution image to generate a downsized combined image having desired dimensions. Not only does the downsizing algorithm decrease the size of the combined image without decreasing the information it holds, but because the previous upscaling is performed using a non-linear machine learning algorithm, the combined process of upscaling and downscaling according to the present invention results in a net improvement in the signal to noise ratio.

Figure 3:
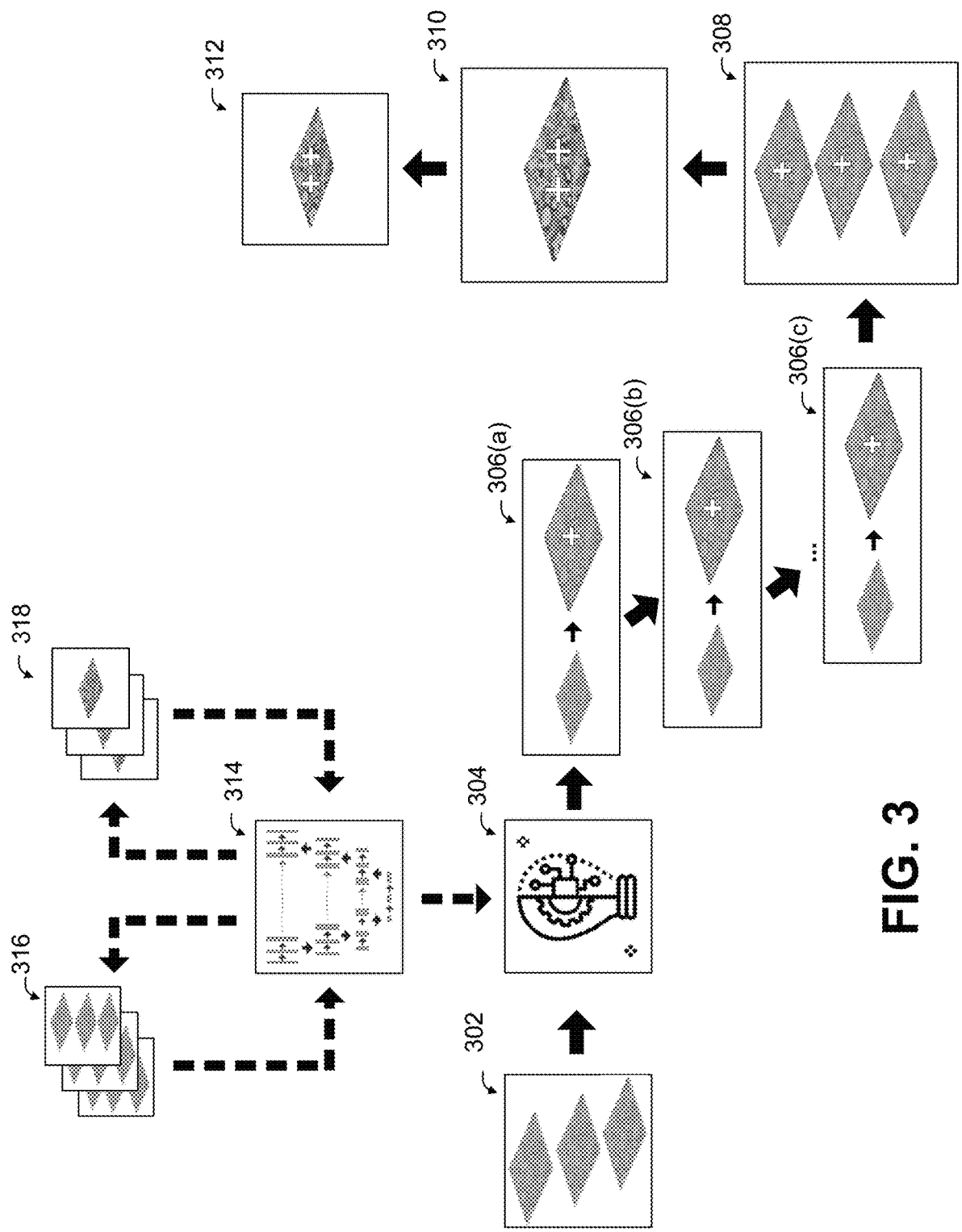
FIG. 3 is a pictographic flow diagram that shows an example process for performing a hybrid machine learning method for enhancing charged particle images according to the present disclosure.

FIG. 3 is a visual flow diagram that illustrates example processes for performing a hybrid machine learning method for enhancing charged particle images according to the present disclosure. Specifically, FIG. 3 shows a series of captured images 300 that demonstrate an example performance of an example process 200 described in the remarks regarding FIG. 2.

Image 302 shows the acquisition of a plurality of low-resolution images of a sample, where individual images of the low-resolution images are generated from emissions resultant from one or more corresponding pulses of a pulsed charged particle beam being incident on the region of interest. The plurality of low-resolution sample images may be generating the plurality of images based on detector data, the low-resolution images may be acquired by accessing a plurality of premade low-resolution images, or a combination thereof.

An image enhancement algorithm depicted symbolically in image 304 is applied to the plurality of low-resolution images of a sample in 302 and/or the data used to generate a plurality of enhanced super-resolution images of the sample. Specifically, the image enhancement algorithm corresponds to, or has a component portion that corresponds to, a machine learning algorithm (e.g., an artificial neural network (ANN), convolutional neural network (CNN), Fully Convolution Neural Network (FCN) etc.) trained to upscale super-resolution images to generate upscaled super-resolution images having increased pixel dimensions. Images 306(a)-(c) show the results of the image enhancement algorithm. Specifically, images 306(a)-(c) show an individual low-resolution image being upscaled to generate an individual upscaled super-resolution image. Images 308 and 310 show a plurality of the individual upscaled super-resolution images being collected and then combined to form a combined upscaled high-resolution image. Image 312 shows the combined upscaled high-resolution image after a downscaling algorithm has been applied to it, generating a high-resolution combined of a desired size. It is understood by people in the art how, because the previous upscaling is performed using a non-linear machine learning algorithm, the combined process of upscaling and downscaling according to the present invention results in a net improvement in the signal to noise ratio.

Images 314-318 illustrate an optional process for training one or more neural network components of the image enhancement algorithm. In this process, training data (shown in image 316) corresponding to low-resolution training images acquired irradiation of samples using a pulsed charged particle beam (e.g., images shown in 302, other low-resolution images acquired using a pulsed charge particle beam, simulated low-resolution images, etc.). Image 216 illustrates labeled data which corresponds to a second set of high-resolution training images that each correspond to a combined image of a corresponding set of low-resolution training images shown in 316. This training data are input into a neural network training process, illustrated in image 314. The image enhancement algorithm may be periodically retrained, and/or a plurality of image enhancement algorithm may be trained such that each image enhancement algorithm is optimized for particular microscope, experiment specifications, and/or sample settings. People having skill in the art will understand that, while image 314 depicts a U-net training process, in various other embodiments other training processes can be used to train the depth blur reducing algorithm.

Figure 4:
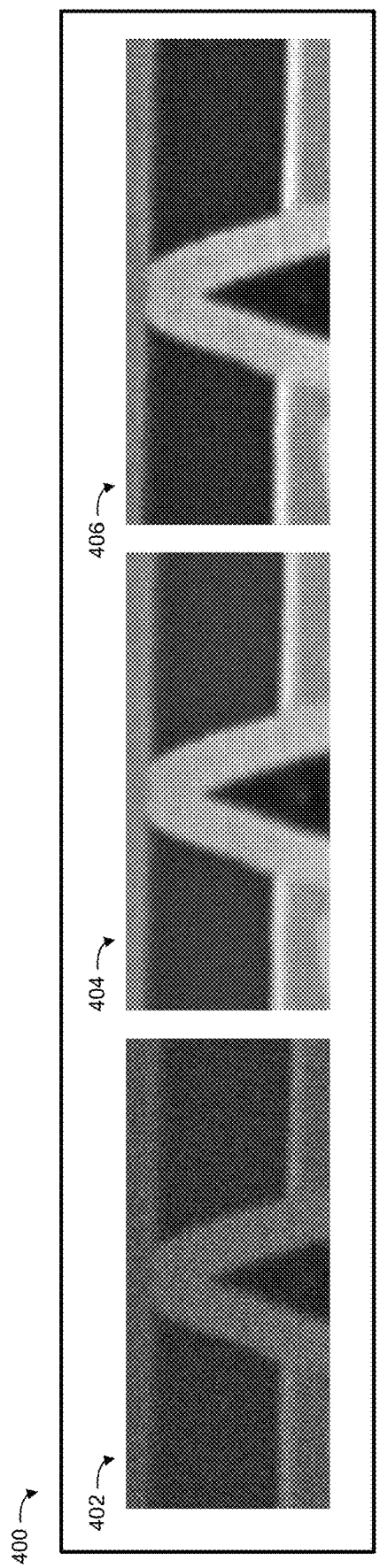
FIGS. 4 and 5 are a collection of captured images that example sample images that have been processed through prior art techniques and by hybrid machine learning methods for enhancing charged particle images according to the present disclosure, and according to the prior art.
Figure 5:
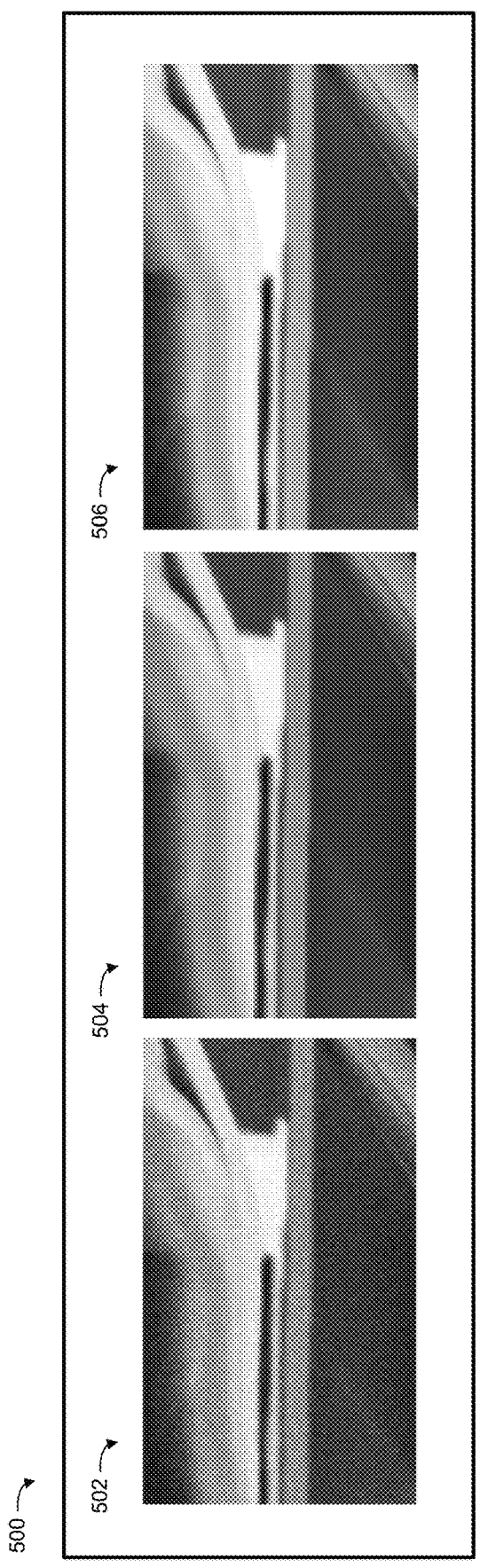

FIGS. 4 and 5 show example sample images that have been processed through prior art techniques and by hybrid machine learning methods for enhancing charged particle images according to the present disclosure, and according to the prior art. FIGS. 4 and 5 show individual low-resolution image 402 and of a first sample and second sample, respectively, that have been obtained via irradiation of the samples using a pulsed electron beam. A person having skill in the art would understand that images 402 and 502 would each be one of a plurality of low-resolution images that would be generated during such irradiation, with individual low-resolution images being generated from the emissions resultant from different pulses and/or collection of pulses. Images 404 and 504 each correspond to combined high-resolution images that have been generated using prior art techniques from the set of plurality of low-resolution images including image 402 and 504, respectively. Images 406 and 506 correspond to combined high-resolution images that have been generated from the set of plurality of low-resolution images including image 402 and 504, respectively, using hybrid machine learning methods for enhancing charged particle images according to the present disclosure.

Examples of inventive subject matter according to the present disclosure are described in the following enumerated paragraphs.

A1. A method for acquiring high resolution, low noise, images of a sample from data obtained in a charged particle microscope using a pulsed charged particle beam, the method comprising the steps of: acquiring a plurality of images of a region of a sample, wherein the plurality of images were generated by irradiating the sample with a pulsed charged particle beam; upscale each of the individual images to generate a plurality of upscaled images of the region of the sample, wherein each of the individual upscaled images corresponds to a different pulse of the pulsed charged particle beam; and combine the plurality of upscaled images to form a noise reduced image of the region of the sample.

A2. The method of paragraph A1, wherein acquiring the plurality of images comprises acquiring detector data obtained by a detector system in the charged particle microscope system.

A2.1. The method of paragraph A1, further comprising generating the plurality of images from the detector data.

A2.2. The method of any of paragraphs A2-A2.1, wherein the detector data comprises a plurality of discrete instances of detector data, each of the instances of detector data corresponding to detector data acquired in a certain time period corresponding to one or more pulses of the pulsed charged particle beam.

A2.2.1. The method of paragraph A2.2, wherein the certain time periods are discrete.

A2.3. The method of any of paragraphs A2-A2.2.1, wherein correspond to the one or more pulses of the pulsed charged particle beam means that the detector data is generated by emissions result from the one or more pulses being incident on the sample.

A2.4. The method of any of A1-A2.3, wherein each image of the plurality of images is generated based on detector data captured in response to a pulse of the pulsed charged particle beam irradiating the sample.

A3. The method of any of A1-A2.4, wherein the pulsed charged particle beam is a pulsed electron beam.

A4. The method of any of A1-A3, wherein upscaling each of the plurality of images comprises improving one or more of a signal to noise ratio, a contrast to noise ratio, and a uniform brightness of images acquired by the charged particle system.

A5. The method of any of paragraphs A1-A3, wherein combining the plurality of upscaled images to form a noise reduced image of the region of the sample corresponds to combining the information in the plurality of images to generate the combined image.

A5.1. The method of paragraph A5, wherein the individual images of the plurality of images are low information images.

A5.2. The method of any of paragraphs A5-A5.1, wherein the individual images of the plurality of images are noise images.

A5.2. The method of any of paragraphs A5-A5.1, wherein combining the plurality of upscaled images to form a noise reduced image of the region of the sample corresponds to aligning the images by performing a drift correction to generate a DCFI image.

A6. The method of any of paragraphs A1-A5.2, wherein upscaling each of the individual images to generate a corresponding upscaled image comprises applying an image upscaling algorithm to the individual image.

A6.1. The method of paragraph A6, wherein the upscaling algorithm increases the dimensions of the individual image.

A6.1.1. The method of paragraph A6.1, wherein the upscaling algorithm non-linearly increases the dimensions of the individual image.

A6.2. The method of any of paragraphs A6-A6.1.1, wherein the algorithm further adjusts one or more of the contrast, brightness, gamma and gray scale to desired level(s).

A6.2.1. The method of paragraph A6.2, wherein the algorithm comprises an auto leveling filter that adjusts one or more of the contrast, brightness, gamma and grayscale to desired level(s).

A6.3. The method of any of paragraphs A6-A6.2.1, wherein the algorithm further reduces an amount of noise in each individual image of the plurality of images.

A6.4. The method of any of paragraphs A6-A6.3, wherein the upscaling algorithm is a machine learning algorithm trained to non-linearly increase the size of the image.

A6.4.1. The method of paragraph A6.4, wherein the machine learning algorithm is trained using: one or more sets of pluralities of training images, wherein each of the plurality of training images were generated by irradiating the sample with a corresponding pulse of a pulsed charged particle beam; and one or more combined training images, wherein each of the combined training images is a drift corrected image composed of the combined image of a corresponding plurality of training images.

A6.4.2. The method of any of paragraphs A6.4-A6.4.1, wherein increasing the size of the image corresponds to increasing the pixel dimensions of the image.

A6.4.3. The method of any of paragraphs A6.4-A6.4.2, wherein increasing the size of the image corresponds to increasing the size by a factor of at least 1.5, 2, or 5.

A6.4.4. The method of any of paragraphs A6.4-A6.4.3, wherein increasing the size of the image corresponds to increasing the size of the image without adding additional information.

A6.4.5. The method of any of paragraphs A6.4-A6.4.4, wherein the upscaling algorithm is a machine learning algorithm trained to apply one or more non-linear transformations to improve the signal to noise ratio and contrast to noise ratio while also increasing the size of the image by a desired factor A6.5. The method of any of paragraphs A6-A6.2.1, wherein the super resolution image is further subjected to a noise reduction process using deep-learning autoencoder architecture to improve the signal to noise ratio.

A7. The method of any of paragraphs A1-A6.5, further enhancing the combined image with an upscaling algorithm to generate an enlarged combined image having larger dimensions than the combined image.

A7.1. The method of paragraph A7, wherein the upscaling algorithm is a machine learning algorithm trained to non-linearly increase the size of the combined image.

A7.1.1. The method of paragraphs A7.1, wherein increasing the size of the image corresponds to increasing the pixel dimensions of the image.

A7.2. The method of any of paragraphs A7-A7.1.1, wherein the algorithm further adjusts one or more of the contrast, brightness, gamma and gray scale to desired level(s).

A7.2.1. The method of paragraph A7.2, wherein the algorithm comprises an auto leveling filter that adjusts one or more of the contrast, brightness, gamma and grayscale to desired level(s).

A7.3. The method of any of paragraphs A7.1-A7.2.1, wherein the machine learning algorithm is trained to enhance the resolution of the image with reduced loss of image information.

A7.3.1. The method of paragraph A7.3, wherein the machine learning algorithm is trained to enhance the resolution of the image without loss of image information.

A8. The method of any of paragraphs A1-A7.3.1, further comprising using a downsizing algorithm to downsize one of the combined images and the enhanced combined image to generate a downsized combined image having desired dimensions.

A8.1. The method of paragraph A8, wherein the downsizing algorithm is a cubit interpolation algorithm A8.2. The method of any of paragraphs A8-A8.1, wherein the downsizing algorithm downsizes the combined image so that it has a better signal to noise ratio.

A8.3. The method of any of paragraphs A8-A8.2, wherein the downsizing algorithm decreases the size of the image without decreasing the information.

B1. A computer readable media storing non-transitory computer readable instructions that, when executed by a processor cause the processor to initiate performance of the method of any of paragraphs A1-A8.3.

C1. A charged particle system for acquiring high resolution, low noise, images of a sample using a pulsed charged particle beam, the charged particle system comprising: a pulsed charge particle source configured to emit a pulsed charged particle beam towards the sample; an optical column configured to direct the pulsed charged particle beam to be incident on the sample; a sample holder configured to hold the sample; a detector system configured to generate detector data from emissions from the sample resultant from one or more pulses of the pulsed charged particle beam being incident on the sample; one or more processors; and a memory storing non-transitory computer readable instructions that, when executed on the one or more processors cause the processors to perform the methods of any of paragraphs A1-A8.3.

D1. Use of the charged particle system of C1 to perform the method of any of the paragraphs A1-A8.3.

What is claimed is:

1. A method for acquiring high resolution, low noise, images of a sample from data obtained in a charged particle microscope using a pulsed charged particle beam, the method comprising the steps of:
   acquiring a plurality of low-resolution images of a region of the sample, wherein the plurality of low-resolution images includes individual low-resolution images and was generated by irradiating the sample with the pulsed charged particle beam;
   upscaling each of the individual low-resolution images to generate a plurality of upscaled super-resolution images of the region of the sample, wherein each of the individual upscaled super-resolution images corresponds to a different pulse of the pulsed charged particle beam;
   identifying a visual feature in common among the plurality of upscaled super-resolution images; and
   combining the plurality of upscaled super-resolution images to form a high-resolution image of the region of the sample based at least in part on the visual feature.

2. The method of claim 1, wherein acquiring the plurality of low-resolution images comprises:
   acquiring a plurality of discrete instances of detector data obtained by a detector system communicatively coupled with the charged particle microscope, wherein each of the instances of detector data corresponds to detector data acquired in a certain time period corresponding to one or more pulses of the pulsed charged particle beam; and
   generating the plurality of low-resolution images from the detector data, wherein each image of the plurality of low-resolution images is generated based on detector data captured in response to the one or more pulses of the pulsed charged particle beam irradiating the sample.

3. The method of claim 1, wherein upscaling each of the plurality of low-resolution images comprises improving one or more of a signal to noise ratio, a contrast to noise ratio, and a uniform brightness of images acquired by the charged particle microscope.

4. The method of claim 1, wherein combining the plurality of upscaled super-resolution images to form the high-resolution image, high signal to noise ratio (SNR) image of the region of the sample corresponds to combining information in the plurality of low-resolution images to generate the high-resolution image.

5. The method of claim 4, wherein combining the plurality of upscaled super-resolution images to form the high-resolution image of the region of the sample corresponds to aligning the upscaled super-resolution images by performing a drift correction to generate a Drift Corrected Frame Integrated (DCFI) image.

6. The method of claim 1, wherein upscaling each of the individual super-resolution images to generate a corresponding upscaled super-resolution image comprises applying an image upscaling algorithm to the individual super-resolution images.

7. The method of claim 6, wherein the image upscaling algorithm comprises (i) an auto leveling filter that adjusts one or more of a contrast, a brightness, a gamma or a grayscale to desired level(s) or (ii) a machine learning algorithm trained to non-linearly upsize each of the individual low-resolution images.

8. The method of claim 1, wherein each of the individual upscaled super-resolution images uniquely corresponds to a different pulse of the pulsed charged particle beam.

9. The method of claim 7, wherein the machine learning algorithm is trained using:
   one or more sets of pluralities of low-resolution training images, wherein each of the pluralities of low-resolution training images were generated by irradiating the sample with a corresponding pulse of a second pulsed charged particle beam; and
   one or more combined high-resolution training images, wherein each of the combined high-resolution training images is a drift corrected image composed of the combined information of a corresponding set of low-resolution training images.

10. The method of claim 9, further comprising using a downsizing algorithm to downsize the high-resolution image to generate a downsized combined image having desired dimensions.

11. The method of claim 10, wherein the process of non-linearly upsizing the individual super-resolution images and downsizing the high-resolution image results in a net improvement in a signal to noise ratio of a final image.

12. The method of claim 7, wherein upsizing each of the individual low-resolution images corresponds to increasing a size of each of the individual low-resolution images without adding additional information.

13. The method of claim 1, wherein the high-resolution image is further subjected to a noise reduction process using a deep-learning auto-encoder architecture to improve a signal to noise ratio.

14. The method of claim 1, comprising further enhancing the high-resolution image with an upscaling algorithm to generate an enlarged combined high-resolution image having larger dimensions than the high-resolution image.

15. The method of claim 14, wherein the upscaling algorithm is a machine learning algorithm trained to apply on or more non-linear transformations that upsize the high-resolution image.

16. A charged particle system for acquiring high resolution, low noise, images of a sample using a pulsed charged particle beam, the charged particle system comprising;
   a pulsed charge particle source configured to emit the pulsed charged particle beam towards the sample;
   an optical column configured to direct the pulsed charged particle beam to be incident on the sample;
   a sample holder configured to hold the sample;
   a detector system configured to generate detector data from emissions from the sample resultant from one or more pulses of the pulsed charged particle beam being incident on the sample;
   one or more processors; and
   a memory storing non-transitory computer readable instructions that, when executed on the one or more processors cause the processors to perform the steps:
      acquiring a plurality of low-resolution images of a region of the sample, wherein the plurality of low-resolution images includes individual low-resolution images and was generated by irradiating the sample with the pulsed charged particle beam;

upscaling each of the individual low-resolution images to generate a plurality of upscaled super-resolution images of the region of the sample, wherein each of the individual upscaled super-resolution images corresponds to a different pulse of the pulsed charged particle beam;

identifying a visual feature in common among the plurality of upscaled super-resolution images; and combining the plurality of upscaled super-resolution images to form a high-resolution reduced image of the region of the sample based at least in part on the visual feature.

17. The charged particle system of claim 16, wherein upscaling each of the individual low-resolution images to generate a corresponding upscaled super-resolution image comprises applying an image upscaling algorithm to the individual low-resolution images, and the process further comprises using a downsizing algorithm to downsize the high-resolution image to generate a downsized combined image having desired dimensions.

18. The charged particle system of claim 17, wherein the image upscaling algorithm is a machine learning algorithm trained to apply one or more non-linear transformations that upsize each of the individual low-resolution image, and wherein the process of non-linearly upsizing the individual super-resolution images and downsizing the high-resolution image results in a net improvement in a signal to noise ratio.

19. The charged particle system of claim 18, wherein the machine learning algorithm is trained using:

one or more sets of pluralities of low-resolution training images, wherein each of the pluralities of low-resolution training images were generated by irradiating the sample with a corresponding pulse of a second pulsed charged particle beam; and one or more combined high-resolution training images, wherein each of the combined high-resolution training images is a drift corrected image composed of the combined information from a corresponding plurality of low-resolution training images.

20. A computer readable media storing non-transitory computer readable instructions that, when executed by a processor cause the processor to initiate performance of the steps:

acquiring a plurality of low-resolution images of a region of a sample, wherein the plurality of low-resolution images includes individual low-resolution images and was generated by irradiating the sample with a pulsed charged particle beam;

upscaling each of the individual low-resolution images to generate a plurality of upscaled super-resolution images of the region of the sample, wherein each of the individual upscaled super-resolution images corresponds to a different pulse of the pulsed charged particle beam;

identifying a visual feature in common among the plurality of upscaled super-resolution images; and combining the plurality of upscaled super-resolution images to form a high-resolution image of the region of the sample based at least in part on the visual feature.

* * * * *